US007539008B2

(12) United States Patent
Chang et al.

(10) Patent No.: US 7,539,008 B2
(45) Date of Patent: May 26, 2009

(54) CLOSING MECHANISM

(75) Inventors: Jung-Wen Chang, Tao Yuan Shien (TW); Ching-Cheng Wang, Tao Yuan Shien (TW); Wan-Chi Lin, Taichung (TW)

(73) Assignee: Quanta Computer Inc., Tao Yuan Shien (TW)

( * ) Notice: Subject to any disclaimer, the term of this patent is extended or adjusted under 35 U.S.C. 154(b) by 357 days.

(21) Appl. No.: 11/534,507

(22) Filed: Sep. 22, 2006

(65) Prior Publication Data

US 2007/0293068 A1 Dec. 20, 2007

(30) Foreign Application Priority Data

Jun. 15, 2006 (TW) .............................. 95210473 U

(51) Int. Cl.
*H05K 5/00* (2006.01)
*H05K 7/00* (2006.01)

(52) U.S. Cl. .............................. 361/679.4; 361/679.45

(58) Field of Classification Search ............. 361/679.4, 361/679.45, 684
See application file for complete search history.

(56) References Cited

U.S. PATENT DOCUMENTS

| | | | | |
|---|---|---|---|---|
| 5,199,888 | A * | 4/1993 | Condra et al. | 439/142 |
| 5,313,596 | A * | 5/1994 | Swindler et al. | 710/303 |
| 5,356,729 | A * | 10/1994 | Pedicini | 429/27 |
| 5,815,225 | A * | 9/1998 | Nelson | 349/65 |
| 6,552,909 | B1 * | 4/2003 | Liebenow | 361/725 |
| 6,652,297 | B1 * | 11/2003 | Zhang et al. | 439/136 |

* cited by examiner

*Primary Examiner*—Jayprakash N Ghandi
*Assistant Examiner*—Anthony M Haughton
(74) *Attorney, Agent, or Firm*—Rabin & Berdo, PC

(57) ABSTRACT

A closing mechanism applicable to an electronic device, computer device or docking device comprises a housing, a closing member, a base, an elastomer and a support. Sliding portion and the corresponding chutes are disposed at the bottom portions of the closing member and the base, respectively. Both ends of the elastomer are fastened to the hooks of the closing member and base; thus, via elasticity, the elastomer automatically closes the opening of the I/O port of the closing mechanism.

8 Claims, 3 Drawing Sheets

CLOSING MECHANISM

RELATED APPLICATIONS

The present application is based on, and claims priority from, Taiwan Application Serial Number 95210473, filed Jun. 15, 2006, the disclosure of which is hereby incorporated by reference herein in its entirety.

BACKGROUND

1. Field of Invention

The present invention relates to a closing mechanism. More particularly, the present invention relates to an automatic closing mechanism.

2. Description of Related Art

Desktop computers, laptop computers and docking devices normally have more than one I/O port (input/output port) to connect to various external devices. I/O ports may include USB (universal serial bus) ports, IEEE1394 ports, D-sub ports, print ports or internet ports. These I/O ports are used to connect to external devices. These external devices may include a mouse, a keyboard, a cell-phone, a DSC (digital still camera) and so on. FIG. 1 is a schematic of a traditional computer device. The computer device 1 includes a display unit 10, a base 20 and a hinge unit 30, wherein the side back of the base 20 contains multiple I/O ports such as USB port 40*a*, USB port 40*b* and internet port 50. The USB port 40*b* and the internet port 50 are respectively connected to a USB device 41 and an internet line 51. The internal electronic wire of the USB port 40*a* is exposed to the outside directly because no USB device is connected to it. Thus, foreign particles (such as rain, snow or sand) may get into the USB port 40*a*. These foreign particles may cause damage to the USB port and decrease the aesthetic value of both the USB port and the computer rear panel. This is especially true for computers that are often outside for commercial affairs. The I/O ports of an electronic device have a higher probability to get particles inside, thus the device has a higher probability to get damaged or become deformed.

SUMMARY

It is therefore an aspect of the present invention to provide a closing mechanism applicable to an electronic device, computer device or docking for protection. The closing mechanism would automatically close the opening of I/O ports those are not connected to any external device.

The closing mechanism comprises a housing, a closing member, a base an elastomer and a support. Both sides of the bottom portion of the closing member have a sliding portion and the base has corresponding chutes for sliding (i.e. opening and closing of I/O port) more smoothly. Besides, the sliding portion has a ramp section to prevent interference between the closing member and the housing during the opening or closing operation. The support is disposed inside the closing member used to get aligned with the appearance of the closing mechanism and eliminate the sinking feeling during closing operation.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1:
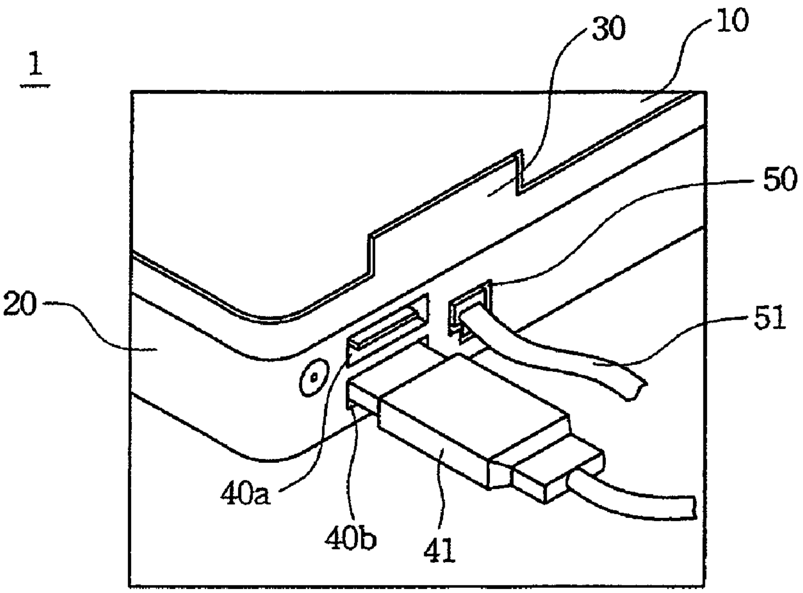
Fig. 1 (PRIOR ART)
FIG. 1 is a schematic diagram of an I/O port of a conventional computer device.
Figure 2:
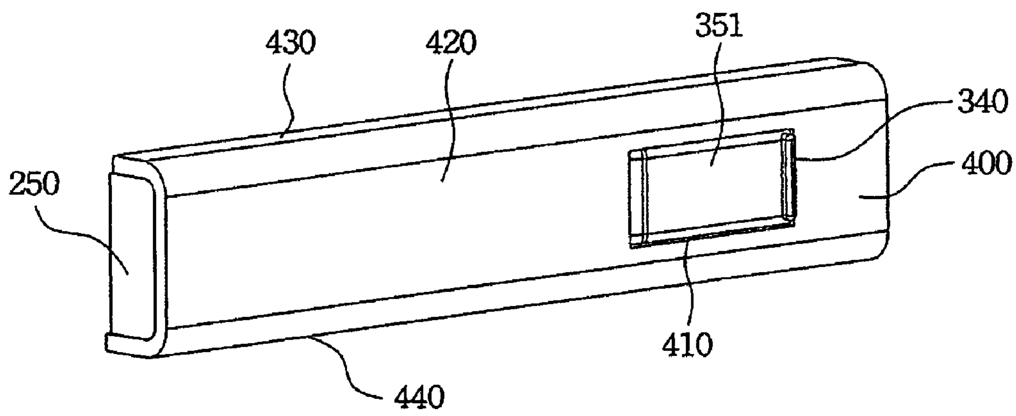
FIG. 2 is an elevation view of a closing mechanism in accordance with a preferred embodiment of the present invention.
Figure 3:
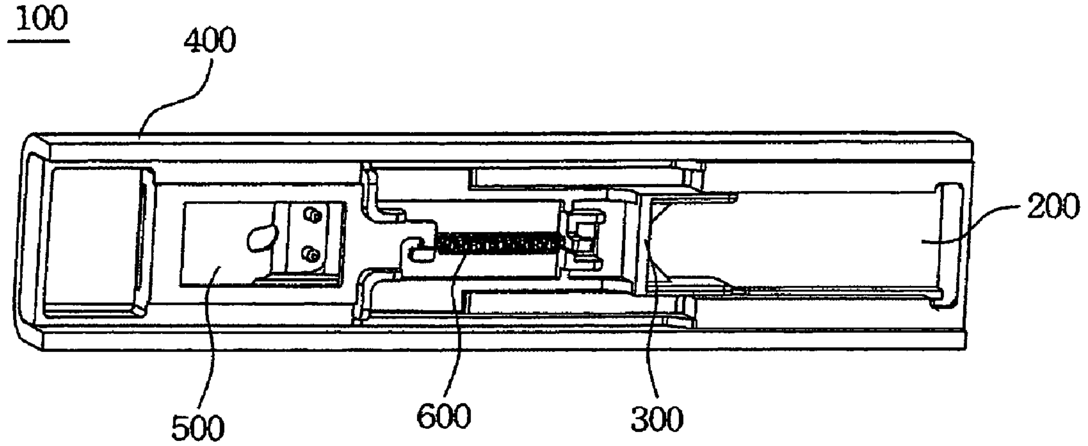
FIG. 3 is rear view of a closing mechanism in accordance with a preferred embodiment of the present invention.
Figure 4:
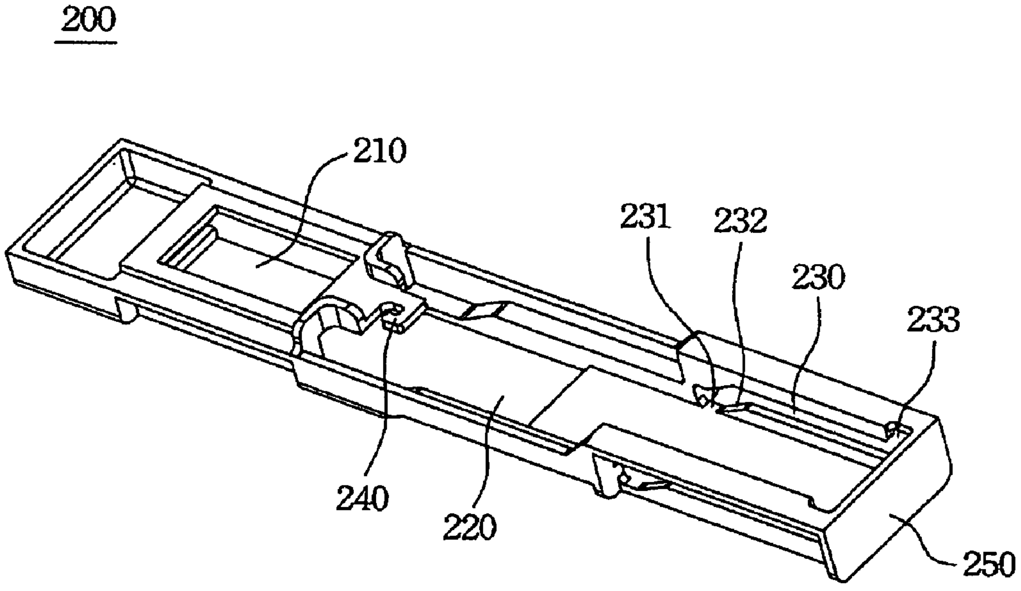
FIG. 4 is a schematic diagram of the base of a closing mechanism in accordance with a preferred embodiment of the present invention.
Figure 5:
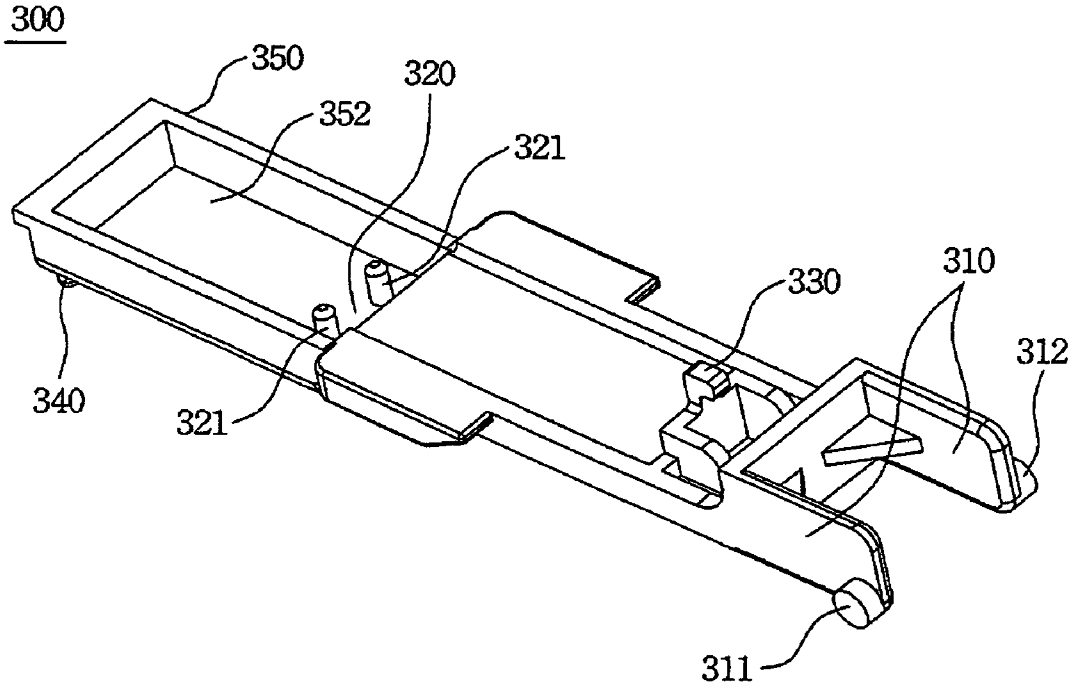
FIG. 5 is a schematic diagram of the closing member of a closing mechanism in accordance with a preferred embodiment of the present invention.

Refer to FIG. 2 and FIG. 3. FIG. 2 and FIG. 3 show an elevation view and a rear view of a closing mechanism in accordance with a preferred embodiment of the present invention, respectively. The closing mechanism 100 comprises a base 200 (FIG. 4 shows more detail), a closing member 300 (FIG. 5 shows more detail) and a housing 400, wherein the housing 400 has a main surface 420, a first side 430 and a second side 440 whose location is opposite to that of the first side 430 and each side of the main surface 420 is connected with the fist side 430 and the second side 440 respectively. The housing 400 also has a first I/O port 410 (input/output port), such as a USB port IEEE1394 port internet port, telephone port, monitor port (D-sub), DVI (Digital Visual Interface) or printer port, on the main surface 420.

FIG. 4 shows a schematic diagram of the base 200 of the closing mechanism 100. The rectangle-shaped base 200 has a base hole 220 (a hollow area) at the center, a second I/O port 210 set by the side of the base hole 220 and a bottom portion 250 set by the other side of the base hole 220. The second I/O port 210 would be just beneath the first I/O port 410 while combine the base 200 with the housing 400 (see FIG. 2). In fact, the first I/O port 410 and the second VO port 210 serve the same external device but are set on different member. Both sides of the bottom portion 250 dispose a chute 230 which comprises a bottom section 231, a ramp section 232 and a top section 233 whereby the interference between the closing member 300 (see FIG. 5) and the base 200 could be avoided.

FIG. 5 shows the closing member 300 in more detail. One end of the closing member 300 sets a closing portion 350 with a first surface 351 (see FIG. 2) and a second surface 352. The closing portion 350 is the physical member for closing and opening an I/O port, for example, the first I/O port 410 and the second I/O port 210 in this case, wherein the first surface 351 is the surface to be viewed when the first I/O port 410 is not connected with any external device. The first side 351 further comprises a convex portion 340 (FIG. 5) for added convenience a user can easily push and then insert an external device into the first I/O port 410. While combining the housing 400, the closing member 300 and the base 200, the first I/O port 410, the second I/O port 210 and the first surface 351 (as well as the second surface 352) would overlap with one another (superimpose).

Figure 6:
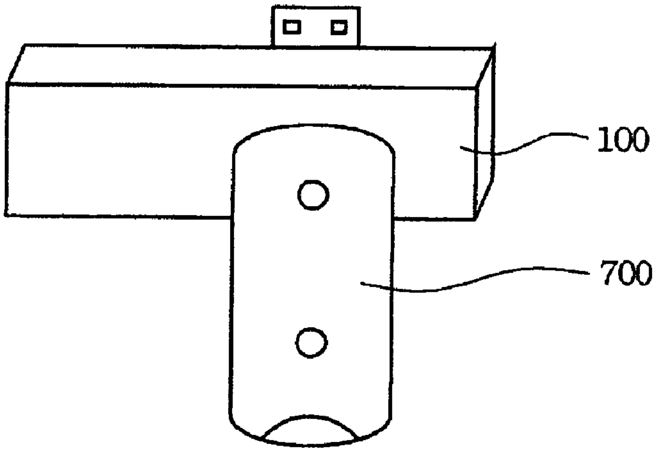
FIG. 6 is an insertion diagram of a closing member in accordance with a preferred embodiment of the present invention.

The other end of the closing member 300 sets a sliding portion 310 with a first sliding portion 311 and a second sliding portion 312 that could be fit into the chute 230 of the base 200, thus, the closing member 300 could be moveable relative to the base 200. When a user pushes the convex portion 340 for inserting an external device into the first I/O port 410, meanwhile, the first sliding portion 311 and the second sliding portion 312 would be pushed from the bottom section 231 through the ramp section 232 toward the top section 233 and then stopped. Because the first surface 351 is beneath the first I/O port 410 of the housing 400 (as well as the second I/O port 210 of the base 200), during the sliding operation above, the first surface 351 would be pushed away from the first I/O port 410 making the first I/O port 410 (as well as the second I/O port 210) exposed to the outside directly allowing the connection of an external device, for example, a dongle, mouse, keyboard, cell phone or DV as shown in FIG. 6.

For providing automatic closing function (i.e. the closing portion 350 would return back to close the fist I/O port 410 and the second I/O port 210) when a user pulls out the external device, the base 200 and the closing member 300 further disposes a first hook 240 (FIG. 4) and a second hook 300 (FIG. 5), respectively. The closing mechanism 100 further comprises an elastomer 600 such as a spring (FIG. 3). The first hook 240 of the base 200 is located by the side of the base hole 220 and the second hook 330 of the closing member 300 is located by the rear side of the sliding portion 310 and the second hook 330 crosses through the base hole 220 and faces the first hook 240. Both ends of the elastomer 600 are fastened by the first hook 240 and the second hook 330 respectively, thus, during the opening operation (i.e. opening the I/O port 210 and 410 in the case), the elastomer 600 would spread and generate elasticity at the same time; once a user pulls the external device out, the elasticity brings the sliding portion 310 from the top section 233 to the bottom section 231, in other words, the closing portion 350 would close the I/O port. Therefore, the closing mechanism 100 would close the I/O ports (210 and 410 in the case) automatically to prevent foreign particles getting into the I/O ports.

Finally, referring to FIG. 3 and FIG. 5, in order to let the closing portion 350 align with the appearance of the closing mechanism 100 and eliminate the sinking feeling when the user pushes the closing member 300, the mechanism 100 further comprises a support 500 (such as a gasket) and the second surface 352 of the closing member 300 comprises a corresponding attachment portion 320 including at least one column 321 to secure the support 500 with.

From the forgoing description, the invention provides the advantages: 1. protects I/O ports against foreign particles; 2. automatic closing and 3. increases the overall aesthetic.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A closing mechanism applicable to an electronic device, comprising:

- a housing, comprising:
  - a main surface with a first side and a second side on each side; and
  - a first I/O port, disposed on the main surface;
- a base, comprising:
- a bottom portion with a chute which has a bottom section, a top section and a ramp section;
  - a second I/O port; and
  - a base hole; and
- a closing member, comprising:
- a closing portion with a first surface and a second surface; and
- a sliding portion with a first sliding portion and a second sliding portion;
- wherein the first sliding portion and the second sliding portion could fit into the chute which makes the closing member moveable relative to the base, the closing member further comprises an attachment portion to attach a support, and the attachment portion includes at least one column.

2. The closing mechanism as claimed in claim 1, wherein the closing member further comprises a convex portion at the first surface and crosses through the first I/O port of the housing.

3. The closing mechanism as claimed in claim 1, wherein the closing member further comprises an elastomer and a second hook, both ends of the elastomer are fastened with a first hook formed on the base and the second hook respectively to generate elasticity during the opening operation.

4. The closing mechanism as claimed in claim 3, wherein the elastomer is a spring.

5. The closing mechanism as claimed in claim 2, wherein the closing member further comprises an elastomer and a second hook, both ends of the elastomer are fastened with a first hook formed on the base and the second hook respectively to generate elasticity during the opening operation.

6. The closing mechanism as claimed in claim 5, wherein the elastomer is a spring.

7. The closing mechanism as claimed in claim 1, wherein the support is a gasket.

8. The closing mechanism as claimed in claim 1, wherein the first I/O port is a USB port, a IEEE1394 port, an internet port, a telephone port, a monitor port (D-sub), a DVI (digital video interface) or a print port.

* * * * *